United States Patent [19]

Ashby et al.

[11] Patent Number: 4,965,806

[45] Date of Patent: Oct. 23, 1990

[54] SEMICONDUCTOR LASER DEVICES HAVING LATERAL REFRACTIVE INDEX TAILORING

[75] Inventors: Carol I. H. Ashby, Edgewood; G. Ronald Hadley, Alburquerque; John P. Hohimer, Albuquerque; Adelbert Owyoung, Albuquerque, all of N. Mex.

[73] Assignee: The United States of America as represented by the United States Department of Energy, Washington, D.C.

[21] Appl. No.: 366,398

[22] Filed: Jun. 15, 1989

[51] Int. Cl.$^5$ ............................................... H01S 3/19

[52] U.S. Cl. ........................................ 372/45; 372/46; 372/50

[58] Field of Search ................. 372/43, 44, 45, 46, 372/50, 96, 34, 36; 357/4, 16, 17

[56] References Cited

U.S. PATENT DOCUMENTS

| | | | |
|---|---|---|---|
| 3,617,929 | 11/1971 | Strack et al. | 331/94.5 |
| 3,959,808 | 5/1976 | King | 357/18 |
| 4,433,417 | 2/1984 | Burnham et al. | 372/45 |
| 4,523,961 | 6/1985 | Hartman et al. | 148/1.5 |
| 4,594,603 | 6/1986 | Holonyak, Jr. | 357/4 |
| 4,624,000 | 11/1986 | Streifer et al. | 372/45 |
| 4,644,553 | 2/1987 | van Ruyven et al. | 357/4 |
| 4,706,255 | 11/1987 | Thornton et al. | 372/50 |
| 4,751,705 | 6/1988 | Hadley et al. | 372/18 |

FOREIGN PATENT DOCUMENTS

| | | | |
|---|---|---|---|
| 0168981 | 7/1986 | Japan | 372/43 |
| 0278292 | 11/1988 | Japan | 372/43 |

OTHER PUBLICATIONS

Nakamura et al., "GaAs—Ga$_{1-x}$Al$_x$As Double-Heterostructure Distributed Feedback Diode Laser," Appl. Phys. Lett., vol. 25, No. 9, Nov. 1, 1974, pp. 487-488.

C. Lindstrom et al., "One Wall CW Visible Single-Quantum-Well Lasers", Electronics Letters, vol. 19, No. 3, 02/0383, pp. 80-81.

D. Welch et al., "2-4W CW, 770 nm Laser Arrays with Nonabsorbing Mirrors," Electronics Lett., vol. 23, No. 10, 05/0787, pp. 525-527.

A. Larsson et al., "High-Efficiency Broad-Area Single-Quantum-Well Lasers with Narrow Single-Lobed Far-Field Patterns Prepared by Molecular Beam Epitaxy", Electronics Letters, vol. 22, No. 2, 01/16/86, pp. 79-81.

J. Salzmann et al., "Phase-Locked Controlled Filament Laser", Applied Physics Letters, vol. 49, No. 11, 09/15/86, pp. 611-613.

G. Hadley et al., "Influence of Thermal Effects on the Eigenmodes of Gain-Guided Diode Laser Arrays", Journal Applied Physics, vol. 61, No. 5, 03/01/87, pp. 1697-1700.

G. Hadley et al., "Free-Running Modes for Gain-Guided Diode Laser Arrays", IEEE Journal of Quantum Electronics, vol. QE-23, No. 6, Jun. 1987, pp. 765-773.

J. Hohimer et al., "Mode Control in Broad-Area Diode Lasers by Thermally Induced Lateral Index Tailoring", Applied Physics Lett., vol. 52, No. 4, 01/25/88, pp. 260-262.

C. Ashby, "Photochemcial Dry Etching of GaAs", Applied Physics Letters, vol. 45, No. 8, 10/15/84, pp. 892-894.

Primary Examiner—William L. Sikes
Assistant Examiner—Georgia Y. Epps
Attorney, Agent, or Firm—Anne D. Daniel; James H. Chafin; William R. Moser

[57] ABSTRACT

A broad-area semiconductor laser diode includes an active lasing region interposed between an upper and a lower cladding layer, the laser diode further comprising structure for controllably varying a lateral refractive index profile of the diode to substantially compensate for an effect of junction heating during operation. In embodiments disclosed the controlling structure comprises resistive heating strips or non-radiative linear junctions disposed parallel to the active region. Another embodiment discloses a multi-layered upper cladding region selectively disordered by implanted or diffused dopant impurities. Still another embodiment discloses an upper cladding layer of variable thickness that is convex in shape and symmetrically disposed about a central axis of the active region. The teaching of the invention is also shown to be applicable to arrays of semiconductor laser diodes.

14 Claims, 2 Drawing Sheets

LASING EMISSION

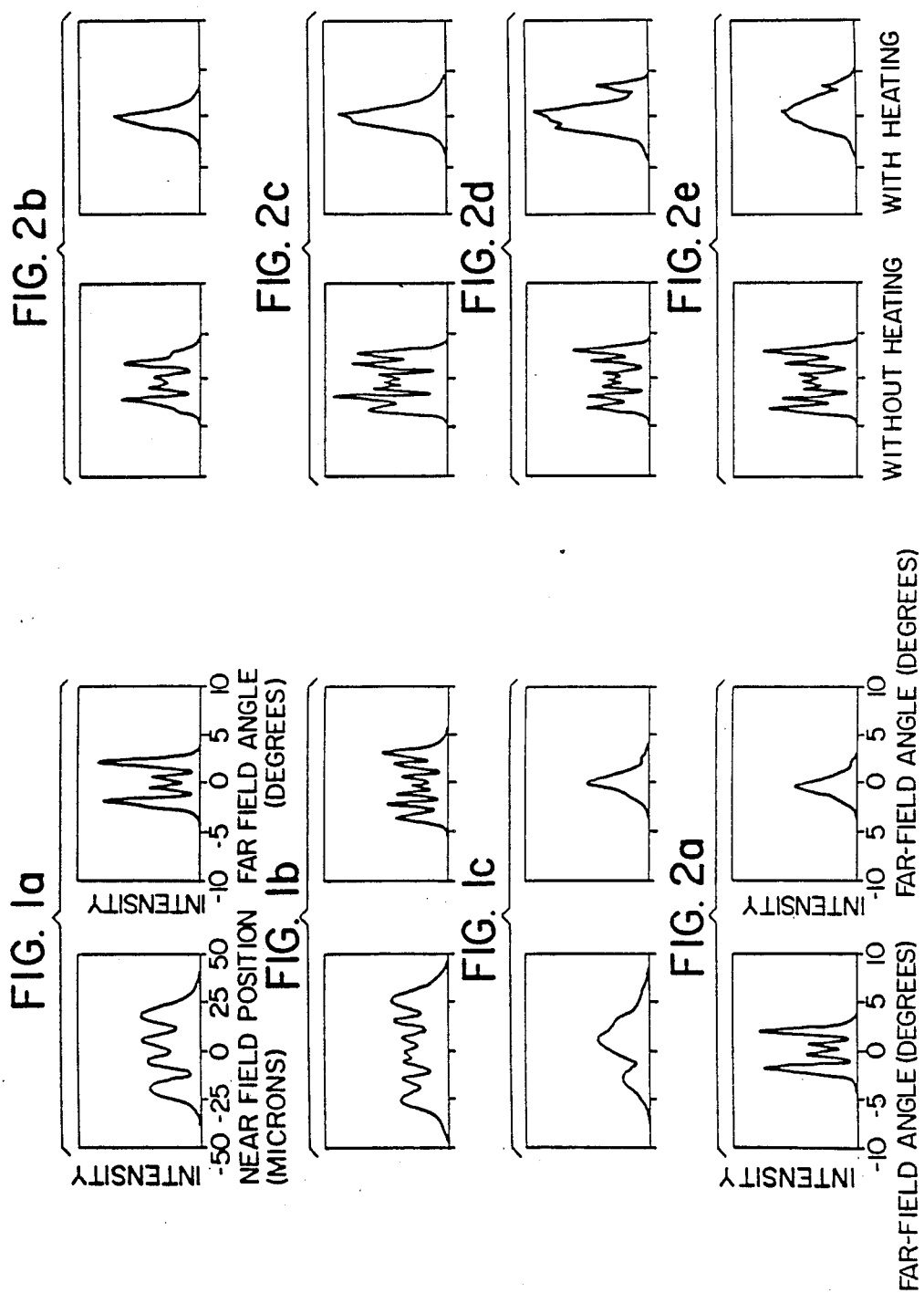

LASING EMISSION

LASING EMISSION

LASING EMISSION

LASING EMISSION

LASING EMISSION

LASING EMISSION

SEMICONDUCTOR LASER DEVICES HAVING LATERAL REFRACTIVE INDEX TAILORING

FIELD OF THE INVENTION

The present invention relates generally to semiconductor laser devices and, in particular, to a semiconductor laser device having mode control achieved by lateral refractive index tailoring. The Government has rights in this invention pursuant to Contract No. DE-AC04-76DP00789 awarded by the U.S. Department of Energy to AT & T Technologies, Inc.

BACKGROUND OF THE INVENTION

Semiconductor diode lasers provide an intense and efficient source of laser radiation. Continuous wave (cw) output powers in excess of one Watt have been achieved with semiconductor diode lasers by using either a broad-area or an array geometry. Such devices, however, operate in multi-lateral modes that give rise to a twin-lobed far-field emission beam in a direction parallel to an active layer of the laser diode. This twin-lobed output beam limits the ability of these conventional laser sources to be focused tightly or to be propagated over long distances. Many potential applications of high-power diode lasers, including optical radar, satellite communication and laser printers, require a single on-axis near-diffraction-limited output beam.

Although considerable effort has been expended to achieve fundamental mode operation in broad-area lasers and diode laser arrays, to date, this goal has only been realized under short-pulse ($<500$ ns), and low-duty-cycle ($\leq 10^{-3}$) conditions under which junction-heating effects, which occur from the flow of current (carriers) through the material, are unimportant. However, it has beer established that junction heating plays an important role in the selection of the lasing modes in both array and broad-area devices for long-pulse and cw operation. Junction heating disadvantageously adds a positive contribution, approximately $4 \times 10\text{-}4c\text{-}1$, to the refractive index in the active region thereby producing an overall index guide that favors multi-lateral mode operation.

It is therefore an object of the invention to provide a semiconductor diode laser having a single on-axis near-diffraction-limited output beam.

It is another object of the invention to provide a semiconductor diode laser having integral structure for controllably varying a lateral refractive index profile of the diode to substantially compensate for the negative effect of junction heating during the operation of the laser diode and to thereby provide for a single on-axis near-diffraction-limited output beam.

SUMMARY OF THE INVENTION

The foregoing problems are overcome and other advantages are realized by a broad-area semiconductor laser diode that includes an active lasing region interposed between an upper and a lower cladding layer, the laser diode further comprising structure for controllably varying a lateral refractive index profile of the diode to substantially compensate for an effect of junction heating during the operation of the laser diode. In embodiments disclosed herein, the controlling structure comprises resistive heating strips or non-radiative linear junctions disposed parallel to the active region. Another embodiment discloses a multi-layered upper cladding region selectively disordered by implanted or diffused dopant impurities. Still another embodiment discloses an upper cladding layer of variable thickness having a convex shape that is symmetrically disposed about a central axis of the active region. The teaching of the invention is also shown to be applicable to arrays of semiconductor laser diodes.

BRIEF DESCRIPTION OF THE DRAWING

The features set forth above, as well as other features of the invention, will be made more apparent in the ensuing Detailed Description of the Invention when read in conjunction with the attached drawings wherein:

FIGS. 1a–1c show near-field and far-field emission patterns from a 60-micron-wide, p-side-up broad-area diode laser operated at $1.1 \times I_{threshold}$;

FIGS. 2a–2e show far-field emission patterns from a 60-micron-wide p-side-up broad-area diode laser with and without two-line heating for injection currents in the range of $1.1$–$1.5 \times I_{threshold}$;

FIG. 4 shows laterally refractive index tailored diode laser arrays for fundamental lateral mode operation. Specifically.

DETAILED DESCRIPTION OF THE INVENTION

Figure 3A:
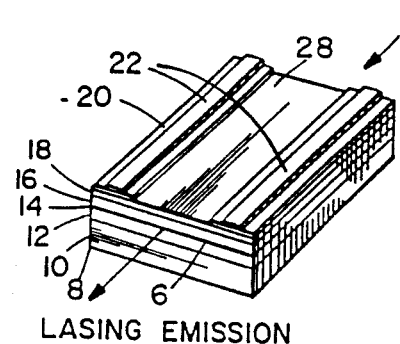
FIGS. 3a–3d illustrate several embodiments of the invention of laterally-refractive-index-tailored broad-area diode lasers for fundamental lateral mode operation.

FIGS. 1a–1c demonstrate the ability to correct for junction-heating effects on the lasing modes of a broad-area diode laser by heating contact metallization adjacent to the active layer of a 60-micron-wide oxide-stripe broad-area laser diode mounted p-side up on a copper heat sink. Under cw operation at 151 mA current ($1.1 \times I_{threshold}$), the diode operated in a $\gamma = 4$ lateral mode characterized by four distinct intensity peaks in the near-field and a twin-lobed far-field pattern (FIG. 1a). By heating the center of the diode active region with a single line-focused beam, approximately $7 \times 250$ micron, from an argon ion laser (488.0 nm), the curvature of the lateral refractive index profile is increased (FIG. 1b) and demonstrates that this increase in heating results in an increase in the lasing mode order. In this regard, it has been observed that an absorbed heating power of only 12 mW shifted the lasing mode order from $\gamma = 4$ to $\gamma = 7$.

FIG. 1c demonstrates that two line sources of external heating, one located on each side of the diode active region, decrease the curvature of the lateral index profile and thereby shift the lasing mode to a lower order and, in particular, to the fundamental mode. For the conditions given above ($1.1 \times I_{threshold}$) an absorbed power of only 18 mW in both externally provided beams was found to be sufficient to achieve fundamental mode laser operation.

Thus, the invention teaches the use of refractive index tailoring to convert the output of a semiconductor diode laser from an off-axis twin-lobed far-field beam of limited usefulness to a much more useful on-axis single-lobed beam. The angular width of this single-lobed output beam (1.6 degrees FWHM) is within a factor of two of the diffraction limit.

To ascertain the degree of mode control achievable by tailoring the lateral index profile in a broad-area laser diode device, the result of a comparison is presented showing the beneficial effect of two-line heating against a free-running (no heating) device for operation over an injection current range 1.1-1 5x$I_{threshold}$ (151-205 mA current).

FIG. 2 shows far-field emission patterns obtained under various conditions. Specifically, FIG. 2a shows the emission patterns obtained at 1.1x$I_{threshold}$, ~19 mW absorbed power, FIG. 2b shows 1.2x$I_{threshold}$, ~39 mW absorbed power, FIG. 2c shows 1.3x$I_{threshold}$, ~47 mW absorbed power, FIG. 2d shows 1.4x$I_{threshold}$, ~52 mW absorbed power, and in FIG. 2e there is shown 1.5x$I_{threshold}$, ~43 mW absorbed power.

As can be clearly seen in FIGS. 2a-2e, the free-running emission exhibits a multi-lobed far-field pattern with the angular separation of the primary or outer lobes increasing from 3.7 degrees at 1.1x$I_{threshold}$ to 5.9 degrees at 1.5$I_{threshold}$. In contrast, using $\leq 50$ mW of absorbed power from an argon-ion laser, the angular width of the far-field emission is reduced considerably and produces a predominantly single-lobed pattern over the entire current range examined. At 1.1x$I_{threshold}$, the far-field width is reduced to 1.6 degrees (FWHM) and increases to 3.5 degrees at 1.5x$I_{threshold}$. At higher currents (>1.5x$I_{threshold}$), the diode output power with external heating was found to decrease relative to the free-running emission power level. This reduction is believed to be related to excessive device heating resulting from both internal and external heating effects.

It has thus been demonstrated that it is possible to obtain fundamental mode operation of cw broad-area devices by tailoring the lateral refractive index profile. In accordance with the invention, this lateral index tailoring is incorporated directly into the structure of a semiconductor diode laser to compensate for thermal effects and provide mode control at high output power levels. The invention provides for (a) the incorporation of an integral refractive index profile above the optical cavity by impurity induced disordering (IID) or (b) modifying the lateral index profile by heating the regions outside of the optical cavity. Several embodiments of the invention are set forth below.

Active control of the lasing mode of a semiconductor diode laser is achieved by selectively heating the diode laser outside of the active region. This heating can be accomplished with an external focused laser source as demonstrated above. However, for many applications this approach may not be optimum.

FIGS. 3a-3d illustrate several embodiments of the invention of laterally-refractive-index-tailored broad-area gain-guided double-heterostructure diode lasers for fundamental lateral mode operation that do not rely on an externally provided laser source. The diode laser of the invention has a relatively wide optical cavity of typically 50-200 microns in width.

Figure 3B:
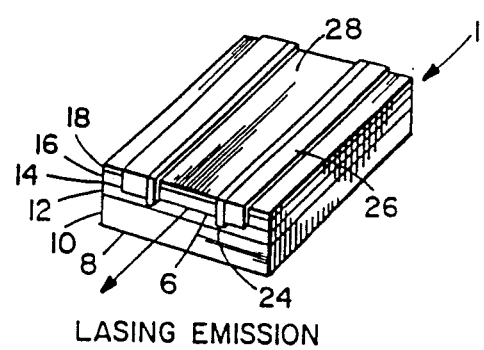

FIG. 3a illustrates thermal control of the lateral index profile by resistance heating while FIG. 3b illustrates embedded semiconductor junction heating. In FIG. 3a the diode 1 includes a substrate 10, with contact metallization 8, a lower cladding layer 12, an active junction layer 14, an upper cladding layer 16 and a cap layer 18. Overlying cap layer 18 is an electrical insulating layer 20, such as $SiO_2$. An opening in the electrical insulating layer directly above the active lasing region 6 is formed photolithographically for the metal contact stripe 28 which supplies current to the lasing region 6. Overlying the electrical insulating layer on either side of the lasing region 6 are two strips 22 of a thick-film or a thin-film resistance material. These heating strips 22 are disposed on the periphery of the active region for, in accordance with the invention, controlling the lateral refractive index profile to achieve mode control. The strips 22 are preferably independently contacted by a source of heater current.

FIG. 3b illustrates similar structure to the diode of FIG. 3a but differing in the heating structure. The heating elements 26 are embedded into the diode structure outside the lasing region 6 as additional independently contacted and forward biased non-lasing direct-gap or indirect-gap semiconductor junctions or as resistive regions formed by either impurity diffusion or ion implantation. The heating elements 26 may be electrically isolated from the active lasing region 6 by proton bombardment to create electrically insulating regions 24. If desired, carrier traps can be implanted into the heating elements 26 to enhance nonradiative recombination. In the embodiments of FIG. 3a and 3b, fundamental mode operation of the diode laser 1 is maintained over a wide operating current range by monitoring the lasing mode and using active feedback to control the heating power levels.

Figure 3C:
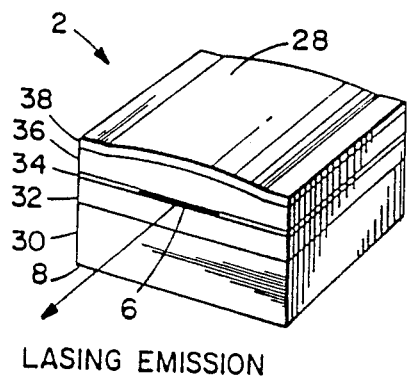
Figure 3D:
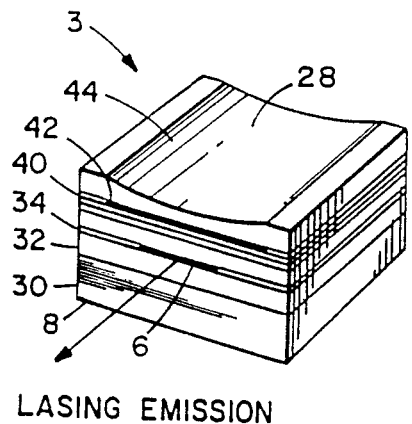

FIG. 3c illustrates the incorporation of a lateral index profile into the laser structure as it is epitaxially grown and FIG. 3d illustrates the incorporation of a lateral index profile into the laser structure after the epitaxial growth process is completed. The teaching of the invention is applicable to a variety of epitaxial growth techniques including but not limited to MBE, MOCVD, and LPE. The invention advantageously provides for a growth process which retains the planarity of the active layer and other epitaxial layers. A diffusion-disordering process of the invention provides a smooth interface well-removed from the active layer.

In FIG. 3c a laser diode 2 includes a substrate 30, with contact metallization 8, lower cladding layer 32, active layer 34 and an upper cladding layer 36. In this embodiment, the epitaxial growth process is halted after the upper cladding layer 36 has been partially or entirely grown. At this point, the upper cladding layer 36 is selectively etched to form a region of varying thickness, creating a tailored refractive index profile. As shown in FIG. 3c, the upper cladding over the lasing region 6 layer 36 produces a lower effective index at the thickest portion overlying the central axis of the active region and coincident with an optical axis of the device. After etching, the semiconductor wafer is returned to the growth apparatus and additional cladding layers of the same or of different composition and/or the cap layer 38 is grown and a metal contact stripe 28 is added to complete the device. An advantage of locating the tailored index profile in the upper cladding layer 36 is that the planarity of the active layer 34 is maintained.

FIG. 3d illustrates another embodiment of the invention wherein a tailored refractive index profile is incorporated into a laser diode 3 structure after the epitaxial growth process is completed. One suitable method of accomplishing this is to provide to the basic laser diode structure an upper cladding layer 40 that includes a multi-layered region 42 such as a superlattice or multi-quantum-well region composed of alternating layers of AlGaAs/GaAs or other semiconducting materials. Disordering of this layered region 42 with a dopant impurity of the same type (p or n) as that in the layered region lowers the effective refractive index. A spatially selective disordering, such as an increased disordering depth and hence lower effective index above the center of the active region, is accomplished by selectively etching a cap layer 44 to serve as a mask for either impurity diffusion, such as Zn diffusion for p-doped or Si diffusion for n-doped material, or ion implantation of Be or Zn for p-doped or Si for n-doped material. The diffusion or implantation step is followed by a step of thermal annealing. A suitable lateral profile, such as the concave region shown, may be etched into the cap layer 44 with conventional wet or dry etching techniques such as reactive ion etching or ion milling, respectively, or by photo-assisted etching. This latter technique permits the projection of the desired etch profile directly onto the cap layer 44 and thereby produces an etched region which directly follows the incident light intensity without any need for masking.

Figure 4A:
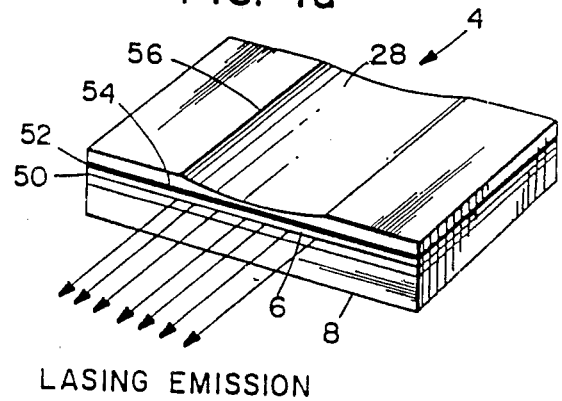
FIG. 4a shows multi-stripe arrays encompassed by an overall tailored-index profile and FIG. 4b illustrates arrays formed by a series of closely coupled tailored-index broad-area lasers locked in phase.
Figure 4B:
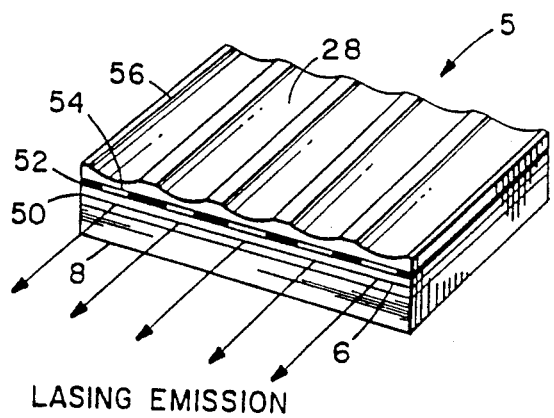

The teaching of the invention of tailoring the lateral refractive index profile to achieve mode control in semiconductor diode lasers is applicable to both broad-area diode lasers and diode arrays. Arrays of diode lasers are formed either by tailoring the lateral index across the width of the array as in FIG. 4a or by tailoring a series of closely spaced broad-area devices which each operate in the fundamental lateral mode as in FIG. 4b. Specifically FIG. 4a shows multi-stripe arrays encompassed by an overall tailored-index profile and FIG. 4b illustrates arrays formed by a series of closely coupled tailored-index broad-area lasers locked in phase. The devices 4 and 5 of FIGS. 4a and 4b each include, above an active region 50, an AlGaAs/GaAs layered upper superlattice or multi-quantum-well cladding region 52, an impurity-diffused or disordered region 54 and a selectively etched cap layer 56. The individual broad-area devices are locked in phase to form a large coherent array by employing evanescent coupling, injection locking, or by incorporating the broad area devices within a common resonant cavity.

Heating studies have also shown that lateral modes other than the fundamental mode can be excited in a broad-area diode laser if the lateral index profile is offset relative to the active region of the device. Thus, when integrating a suitable laterally tailored refractive index profile into the structure of a semiconductor diode laser, the position of the index profile relative to the active region can be used to select modes other than the fundamental for specific applications.

While the invention has been particularly shown and described with respect to presently preferred embodiments thereof, it will be understood by those skilled in the art that changes in form and details may be made therein without departing from the scope and spirit of the invention.

We claim:

1. A broad-area semiconductor laser diode, comprising:
   a substrate;
   an active lasing region disposed between an upper cladding layer and a lower semiconductor layer, to form a diode lasing structure having a heterojuncture;
   a contact stripe on an outer layer of said device for application of current to said device to produce said lasing region;
   a resonant cavity to provide feedback for lasing action; and
   the laser diode further comprising means for controllably varying a lateral refractive index profile of the laser diode across the width of the active lasing region in a sense opposite to the refractive index charge resulting from junction heating and thereby to substantially compensate for an effect of junction heating during the operation of the laser diode and to provide for a single on-axis near-diffraction limited output beam.

2. The laser diode of claim 1 wherein the means for controllably varying comprises a first and a second strip of resistive material disposed along a length of an upper surface of the laser region, each of the strips including terminal means for coupling the strip to a source of heater power for resistively heating the strips.

3. The laser diode of claim 2 and further comprising a layer of electrical insulating material interposed between the strips and the top surface of the laser diode.

4. The laser diode of claim 1 wherein the means for controllably varying comprises a first and a second region embedded within an upper surface of the laser diode on opposite sides of the active lasing region, the first and the second region each being comprised of a non-lasing direct-gap or indirect-gap forward biasing semiconductor junction each which includes terminal means for coupling to a source of operating power for resistively heating these regions.

5. The laser diode of claim 1 wherein the means for controllably varying comprises an upper surface portion of the laser diode that includes a contoured region of varying thickness, the contoured region having a maximum thickness along line substantially colinear with and above a central axis of the active lasing region and being substantially symmetrically disposed thereabout.

6. The laser diode of claim 5 wherein the contoured region includes the upper cladding layer and wherein the upper cladding layer has a convex cross-sectional thickness profile.

7. The laser diode of claim 1 wherein the means for controllably varying comprises a multi-layered region of the upper cladding layer, the multi-layered region being selectively disordered with a dopant impurity to lower the effective refractive index thereof.

8. The laser diode of claim 7 wherein the multi-layered region comprises a superlattice region.

9. The laser diode of claim 7 wherein the multi-layered region comprises a multi-quantum well region.

10. The laser diode of claim 9 wherein the multi-quantum well region comprises alternating layers of AlGaAs/GaAs or other semiconducting materials.

11. The laser diode of claim 7 and further comprising a capping layer overlying the upper cladding layer, the capping layer being selectively etched to form a concave diffusion or implantation mask for applying therethrough the selected dopant impurities to the multi-layered region, the concave mask being symmetrically disposed about a center axis of the active lasing region.

12. The laser diode of claim 11 wherein the capping layer is selectively etched such that the dopant impurities are diffused or implanted to a greatest depth within the multi-layered region at a point above the central axis of the active lasing region.

13. The laser diode of claim 7 wherein a plurality of the active lasing regions are disposed in a parallel manner one to another for forming an array of laser diodes.

14. The laser diode of claim 12 wherein a plurality of the active lasing regions are disposed in a parallel manner one to another for forming an array of laser diodes.

* * * * *